(12) United States Patent
Noda

(10) Patent No.: US 6,359,319 B1
(45) Date of Patent: *Mar. 19, 2002

(54) STATIC RANDOM ACCESS MEMORY CELL HAVING POCKET REGIONS ADJACENT TO SOURCES OF DRIVE TRANSISTORS

(75) Inventor: Kenji Noda, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/065,587

(22) Filed: Apr. 24, 1998

(30) Foreign Application Priority Data

Apr. 25, 1997 (JP) ............................................. 9-108882

(51) Int. Cl.[7] .............................................. H01L 29/76
(52) U.S. Cl. ...................... 257/380; 257/393; 257/903
(58) Field of Search .................................. 257/390, 391, 257/335, 336, 344, 380, 393, 404, 408, 903

(56) References Cited

U.S. PATENT DOCUMENTS

| | | | | |
|---|---|---|---|---|
| 4,933,739 A | * | 6/1990 | Harari ......................... | 257/380 |
| 5,079,611 A | * | 1/1992 | Ikeda et al. .................. | 257/390 |
| 5,391,894 A | * | 2/1995 | Itabashi et al. ............... | 257/67 |
| 5,468,986 A | * | 11/1995 | Yamanashi .................. | 257/389 |
| 5,535,155 A | * | 7/1996 | Abe ............................ | 365/154 |
| 5,536,962 A | * | 7/1996 | Pfiester ....................... | 257/391 |
| 5,578,854 A | * | 11/1996 | Chen et al. .................. | 257/349 |
| 5,843,815 A | * | 12/1998 | Liaw .......................... | 438/238 |
| 5,903,036 A | * | 5/1999 | Onozawa .................... | 257/390 |
| 5,955,746 A | * | 9/1999 | Kim ........................... | 257/336 |

FOREIGN PATENT DOCUMENTS

| | | |
|---|---|---|
| JP | 63-293979 | 11/1988 |
| JP | 6-350042 | 12/1994 |
| JP | 7-169858 | 7/1995 |
| JP | 8-130193 | 5/1996 |
| JP | 8-335697 | 12/1996 |

OTHER PUBLICATIONS

Pierret, Robert F. Volume IV Field Effect Devices, 2nd edition, Addison–Wesley Publishing Company, 1990, pp126–136.*

* cited by examiner

*Primary Examiner*—Sara Crane
(74) *Attorney, Agent, or Firm*—Sughrue Mion, PLLC

(57) ABSTRACT

In a static random access memory cell including two cross-coupled drive MOS transistors and two transfer MOS transistors connected to the drive MOS transistors, a plurality of gate electrodes of the drive MOS transistors and the transfer MOS transistors are formed over a semiconductor substrate, and a plurality of source/drain impurity diffusion regions of the transistors are formed within the semiconductor substrate. A plurality of pocket regions of the same conductivity type as the semiconductor substrate are formed within the semiconductor substrate. Each of the pocket regions is adjacent to the source of one of the drive MOS transistors and beneath the gate electrode thereof. The impurity concentration of the pocket regions is larger than that of the semiconductor substrate.

6 Claims, 9 Drawing Sheets

N-TYPE IMPURITY REGIONS

STATIC RANDOM ACCESS MEMORY CELL HAVING POCKET REGIONS ADJACENT TO SOURCES OF DRIVE TRANSISTORS

BACKGROUND OF THE INVENTION

1. Field of the Invention

The present invention relates to a semiconductor memory device, and more particularly, a static random access memory (SRAM) cell.

2. Description of the Related Art

A prior art SRAM cell is constructed by a flip-flop formed by cross-coupled first and second inverters and transfer transistors connected to first and second nodes of the flip-flop. That is, the first inverter is formed by a first resistance element between a high power supply line and the first node and a first drive MOS transistor between the first node and a ground line. Similarly, the second inverter is formed by a second resistance element between the high power supply line and the second node and a second drive MOS transistor between the second node and the ground line.

Also, the first node is connected directly to a gate electrode of the second drive transistor, so that the second drive transistor is driven directly by the voltage at the first node. Similarly, the second node is connected directly to a gate electrode of the first drive transistor, so that the first drive transistor is driven directly by the voltage at the second node.

In the SRAM cell, the lower the threshold voltage of the transfer transistors, the higher the substantial write voltage. On the other hand, the higher the threshold voltage of the drive transistors, the higher the retention characteristics of the flop-flop against noise. In order to satisfy this requirement, the impurity concentration of a semiconductor substrate (well) of the drive transistors is higher than that of the substrate (well) of the transfer transistors.

The threshold voltage of the drive transistors is higher than the threshold voltage of the transfer transistors.

Additionally, in order to avoid the destruction of data during a write mode, the gate width of the drive transistors is increased while the gate length of the drive transistors is decreased.

In the above-mentioned prior art SRAM cell, however, since the threshold voltage of the drive transistors is set in a range where the threshold voltage greatly depends upon the gate length thereof, the set threshold voltage of the drive transistors greatly fluctuates. This will be explained later in detail.

Note that, in order to suppress the fluctuation of the threshold voltage of the drive transistors, the threshold voltage can be set to be a larger value; however, in this case, the gate length of the transfer transistors has to be larger, which degrades the integration.

SUMMARY OF THE INVENTION

It is an object of the present invention to suppress the fluctuation of the threshold voltage of drive transistors in an SRAM cell without degrading the integration.

According to the present invention, in a static random access memory cell including two cross-coupled drive MOS transistors and two transfer MOS transistors connected to the drive MOS transistors, a plurality of gate electrodes of the drive MOS transistors and the transfer MOS transistors are formed over a semiconductor substrate, and a plurality of source/drain impurity diffusion regions of the transistors are formed within the semiconductor substrate. A plurality of pocket regions of the same conductivity type as the semiconductor substrate are formed within the semiconductor substrate. Each of the pocket regions is adjacent to the source of one of the drive MOS transistors and beneath the gate electrode thereof. The impurity concentration of the pocket regions is larger than that of the semiconductor substrate.

Thus, the short channel effect of the drive transistors is suppressed by the pocket regions.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, a prior art SRAM cell will be explained with reference to FIGS. 1, 2, 3A, 3B, 3C and 4.

Figure 1:
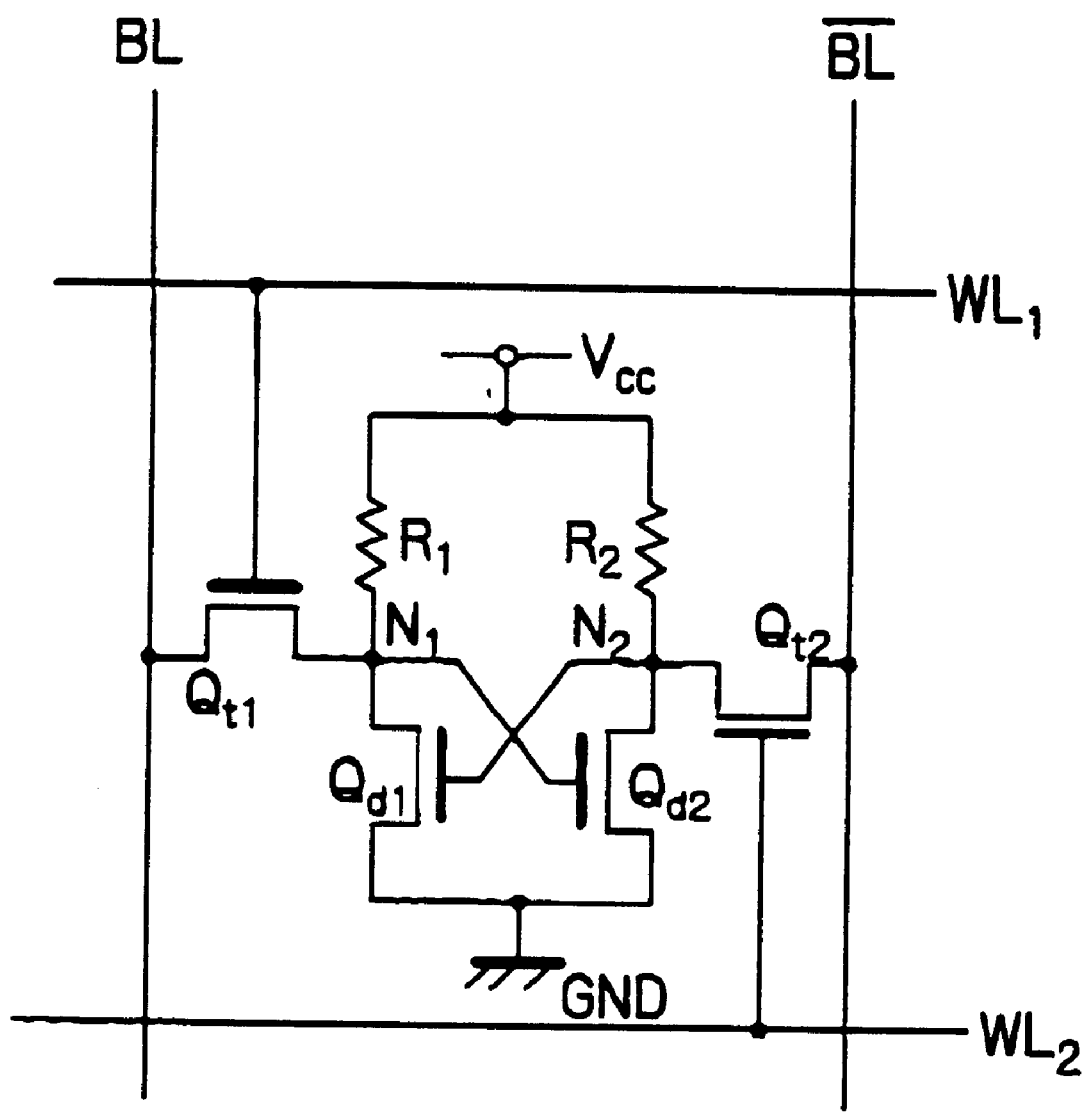
FIG. 1 is an equivalent circuit diagram illustrating a prior art SRAM cell.

In FIG. 1, which is an equivalent circuit diagram illustrating the SRAM cell, one SRAM cell is provided at each intersection between word lines $WL_1$, and $WL_2$ and complementary bit lines BL and $\overline{BL}$. This cell is constructed by a flip-flop formed by two cross-coupled inverters and transfer N-channel MOS transistors $Q_t1$ and $Q_t2$ connected between nodes $N_1$ and $N_2$ of the flip-flop and the bit lines BL and $\overline{BL}$.

The transfer transistors $Q_t1$ and $Q_t2$ are controlled by the voltages at the word line $WL_1$ and $WL_2$. Note that the voltage at the word line $WL_1$ is the same as the voltage at the word line $WL_2$.

Each of the inverters includes a load resistor $R_1$ ($R_2$) and a drive N-channel MOS transistor $Q_d1$ ($Q_d2$) between a power supply line $V_{cc}$ and a ground line GND. The node $N_1$ is connected to the gate of the transistor $Q_d2$, so that the transistor $Q_d2$ is driven by the voltage at the node $N_1$. Also, the node $N_2$ is connected to the gate of the transistor $Q_d1$, so that the transistor $Q_d1$ is driven by the voltage at the node $N_2$.

The structure of the SRAM cell of FIG. 1 is explained next with reference to FIG. 2 and FIGS. 3A, 3B and 3C.

Figure 2:
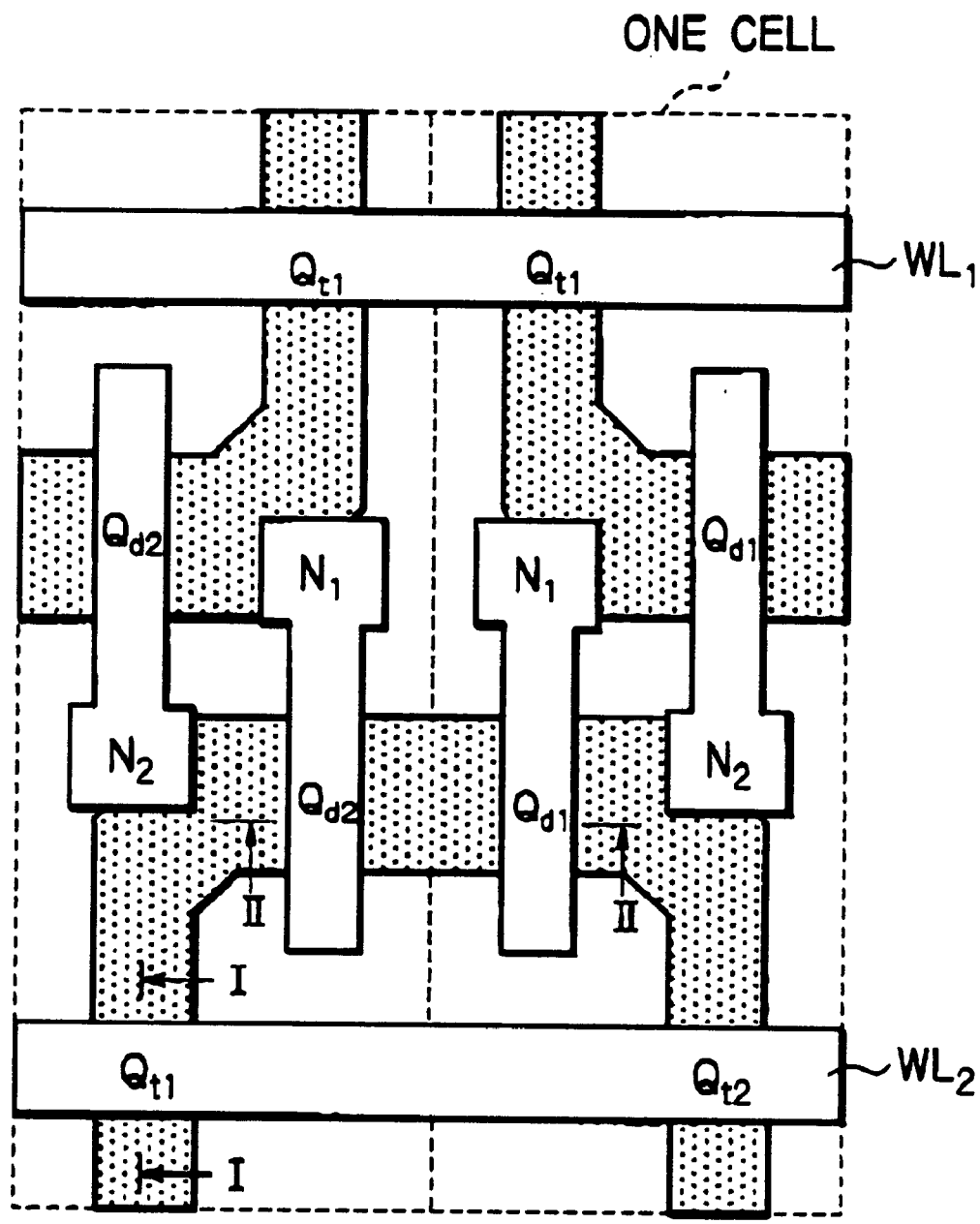
FIG. 2 is a plan view of the SRAM cell of FIG. 1.
Figure 2:
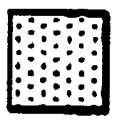
Figure 3A:
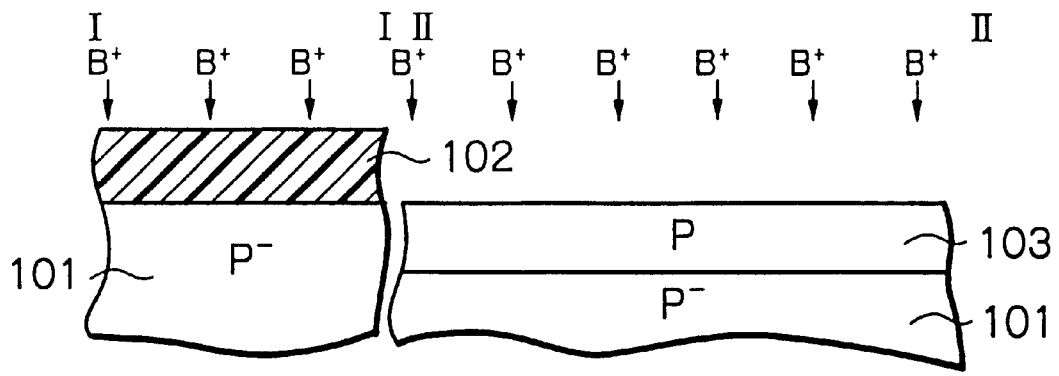
FIGS. 3A, 3B and 3C are cross-sectional views for explaining a method for manufacturing the SRAM cell of FIG. 2.
Figure 3B:
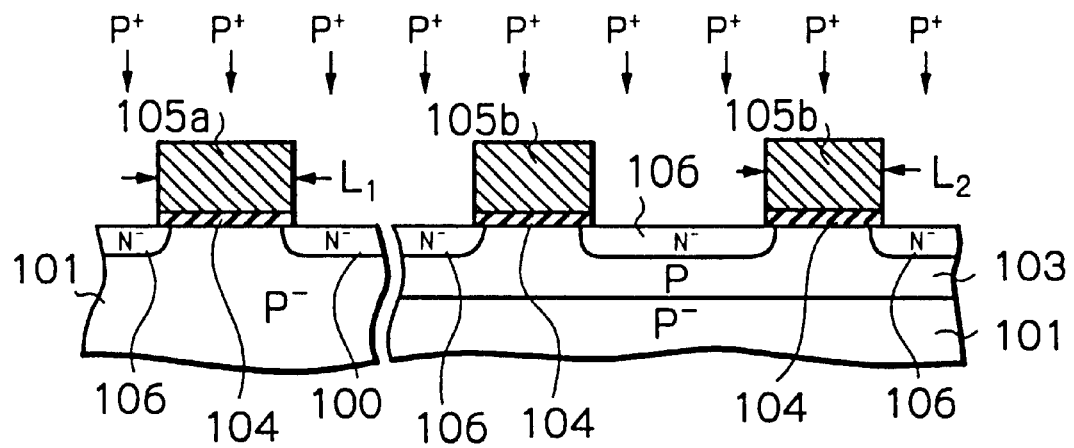
Figure 3C:
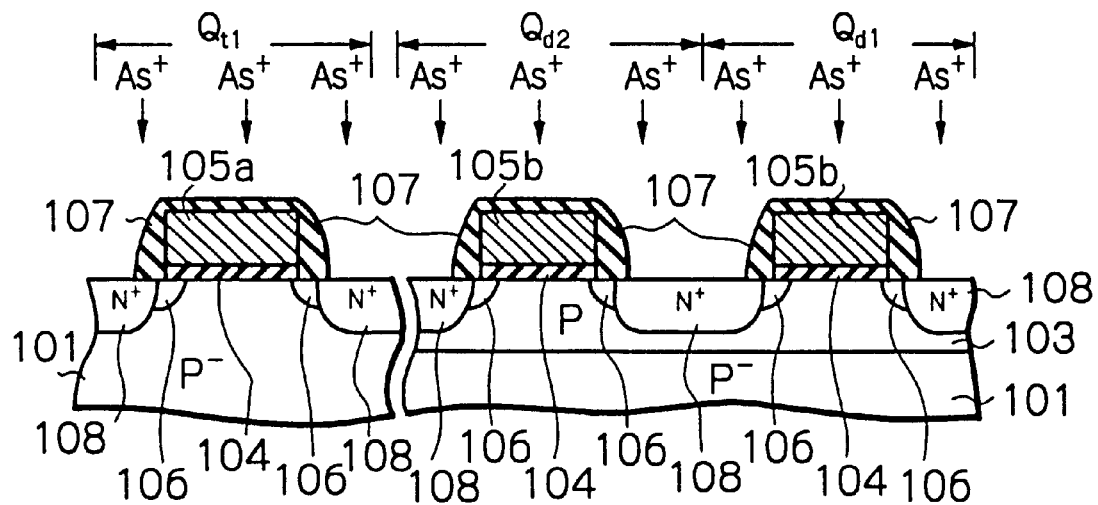

Note that FIG. 2 is a plan view of two-bit SRAM cells, and FIGS. 3A, 3B and 3C are cross-sectional views taken along the lines I—I and II—II of FIG. 2.

First, referring to FIGS. 2 and 3A, a photoresist pattern 102 is formed by a photolithography process on only an area of a P-type monocrystalline silicon substrate 101 corresponding to the gate electrodes of the transfer transistors $Q_t1$ and $Q_t2$ and their periphery. Then, boron ions are implanted into the substrate 101 by using the photoresist pattern 102 as a mask. As a result, a P-type impurity diffusion region 103 is formed within the substrate 101. Then, the photoresist pattern 102 is removed.

Next, referring to FIGS. 2 and 3B, the substrate 101 is thermally oxidized to form a gate silicon oxide layer 104 on the substrate 101. Then, gate electrodes 105a and 105b are formed on the gate silicon oxide layer 104. Then, the gate silicon oxide layer 104 is etched out in self-alignment with the gate electrodes 105a and 105b. Note that the length $L_1$ of the gate electrodes 105a of the transfer transistors $Q_t1$ and $Q_t2$ is larger than the length $L_2$ of the gate electrodes 105b of the drive transistors $Q_d1$ and $Q_d2$. Then, phosphorous or arsenic ions are implanted into the substrate 101 by using the gate electrodes 105a and 105b as a mask to form N-type impurity diffusion regions 106 of a lightly-doped drain (LDD) configuration.

Finally, referring to FIGS. 2 and 3C, a silicon nitride layer is formed on the entire surface, and an anisotropic etching operation is performed upon the silion nitride layer to form a protection layer 107 on the sidewalls and upper surfaces of the gate electrodes 105a and 105b. Then, arsenic ions are implanted into the substrate 101 by using the protection layer 107 as a mask to form N+-type impurity diffusion regions 108 of the LDD configuration. Note that, the lower the threshold voltage $V_{th}1(L)$ of the transfer transistors $Q_t1$ and $Q_t2$, the higher the substantial write voltage. On the other hand, the higher the threshold voltage $V_{th}2(L)$ of the drive transistors $Q_d1$ and $Q_d2$, the higher the retention characteristics of the flop-flop against noise. Therefore, the impurity concentration of the substrate 101 (the P-type type impurity diffusion region 103) of the drive transistors $Q_d1$ and $Q_d2$ is higher than that of the substrate 101 of the transfer transistors $Q_t1$ and $Q_t2$. As a result, as shown in FIG. 4, which shows the threshold voltage characteristics of the transfer transistors $Q_t1$ and $Q_t2$ and the drive transistors $Q_d1$ and $Q_d2$, the threshold voltage $V_{th}2(L)$ of the drive transistors $Q_d1$ and $Q_d2$ is higher than the threshold voltage $V_{th}1(L)$ of the transfer transistors $Q_t1$ and $Q_t2$.

Additionally, in order to avoid the destruction of data during a write mode, the gate width W of the drive transistors $Q_d1$ and $Q_d2$ is increased while the gate length L of the drive transistors $Q_d1$ and $Q_d2$ is decreased.

Figure 4:
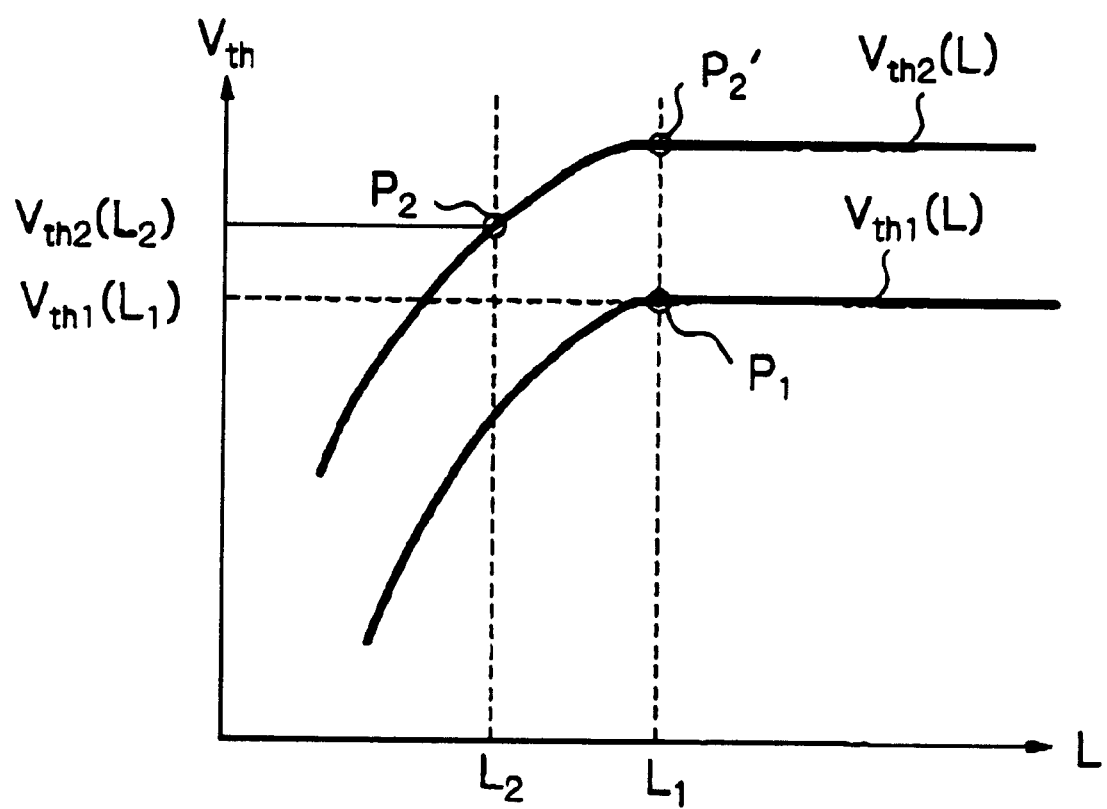
FIG. 4 is a graph showing the threshold voltage characteristics of the transistors of FIG. 2.

In order to satisfy the above-mentioned conditions, the threshold voltage $V_{th}1(L)$ of the transfer transistors $Q_t1$ and $Q_t2$ is set to be a value $V_{th}1(L_1)$ as indicated by $P_1$ in FIG. 4, and the threshold voltage $V_{th}2(L)$ of the drive transistors $Q_d1$ and $Q_d2$ is set to be a value $V_{th}2(L_2)$ as indicated by $P_2$ in FIG. 4.

In FIG. 4, however, since the threshold voltage $V_{th}2(L)$ of the drive transistors $Q_d1$ and $Q_d2$ is set in a range where the threshold voltage $V_{th}2(L)$ greatly depends upon the gate length L thereof, the set threshold voltage $V_{th}2(L_2)$ of the drive transistors $Q_d1$ and $Q_d2$ greatly fluctuates.

In order to suppress the fluctuation of the threshold voltage $V_{th}2(L)$ of the drive transistors $Q_d1$ and $Q_d2$, the threshold voltage $V_{th}2(L)$ can be set to be a value $V_{th}2(L_2')$ as indicated by $P_2'$ in FIG. 4; however, in this case, the gate length L of the transfer transistors $Q_t1$ and $Q_t2$ has to be larger ($L>L_1$), which degrades the integration.

Figure 5A:
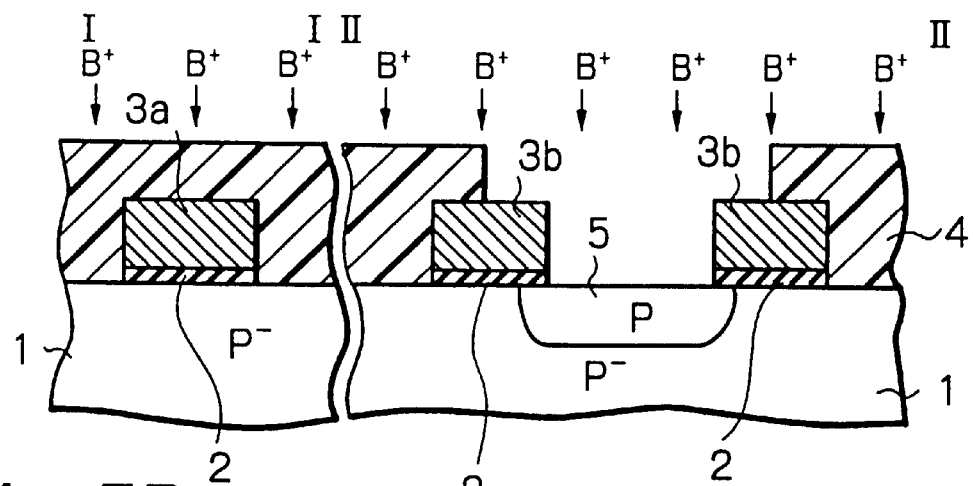
FIGS. 5A, 5B and 5C are cross-sectional views for explaining a first embodiment of the method for manufacturing the SRAM cell according to the present invention.
Figure 5B:
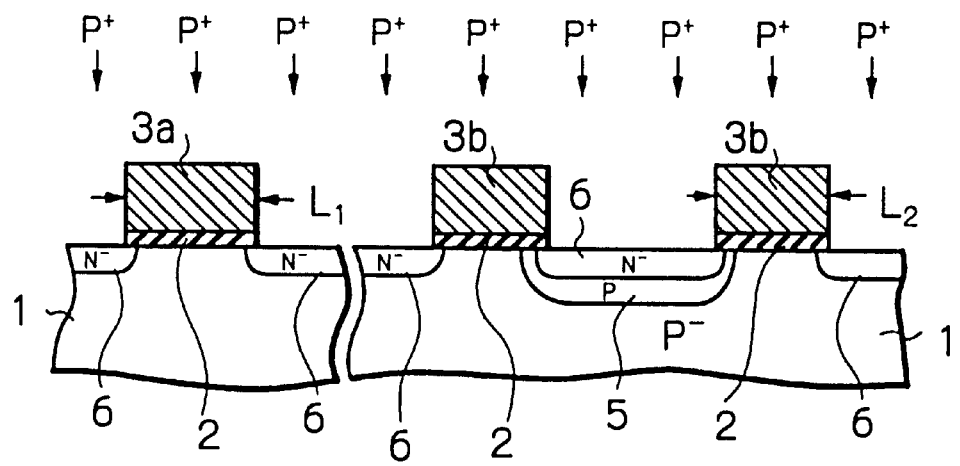
Figure 5C:
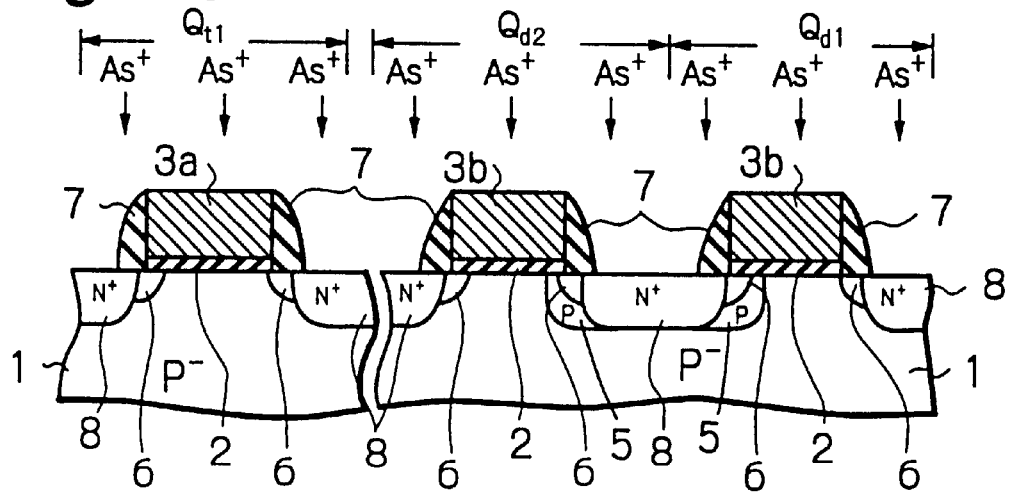

FIGS. 5A, 5B and 5C are cross-sectional views for explaining a first embodiment of the method for manufacturing an SRAM cell according to the present invention. Note that an equivalent circuit and a plan view of this SRAM cell are also illustrated in FIGS. 1 and 2.

First, referring to FIG. 5A, a P-type monocrystalline silicon substrate 1 having an impurity concentration of about $1\times10^{16}$ to $1\times10^{18}$ cm$^3$ is thermally oxidized to form a gate silicon oxide layer 2 on the substrate 1. Then, gate electrodes 3a and 3b are formed on the gate silicon oxide layer 3. Then, the gate silicon oxide layer 2 is etched out in self-alignment with the gate electrodes 3a and 3b. Note that the length $L_1$ of the gate electrodes 3a of the transfer transistors $Q_t1$ and $Q_t2$ is larger than the length $L_2$ of the gate electrodes 3b of the drive transistors $Q_d1$ and $Q_d2$. Then, a photoresist pattern 4 having an opening corresponding to the sources of the drive transistors $Q_d1$ and $Q_d2$ is formed by a photolithography process. Then, about $1\times10^{13}$ to $1\times10^{14}$ boron ions per cm$^2$ are implanted at an energy of about 5 to 30 keV and at an incident angle of 0' to about 60' into the substrate 1 by using the photoresist pattern 4 as a mask. As a result, P-type impurity diffusion regions 5 are formed within the substrate 1. Then, the photoresist pattern 4 is removed.

Next, referring to FIG. 5B, about $1\times10^{13}$ to $1\times10^{14}$ phosphorous or arsenic ions per cm$^2$ are implanted at an energy of about 5 to 30 keV into the substrate 1 by using the gate electrodes 3a and 3b as a mask to form N-type impurity diffusion regions 6 of an LDD configuration.

Finally, referring to FIG. 5C, a silicon nitride layer is formed on the entire surface, and an anisotropic etching operation is performed upon the silion nitride layer to form a sidewall silicon nitride layer 7 on the sidewalls of the gate electrodes 3a and 3b . Then, about $1\times10^{15}$ to $1\times10^{16}$ arsenic ions per cm$^2$ are implanted at an energy of about 10 keV to 100 keV into the substrate 1 by using the sidewall silicon nitride layer 7 as a mask to form N+-type impurity diffusion regions 8 of the LDD configuration.

Thus, in the first embodiment, the N-type impurity diffusion regions 6 having an impurity concentration of about $1\times10^{19}$ cm$^{-3}$ and the N+-type impurity diffusion regions 8 having an impurity concentration of about $2\times10^{20}$ cm$^{-3}$ form the sources/drains of the transistors, and the P-type impurity diffusion regions 5 having an impurity concentration of about $1\times10^{18}$ cm$^{-3}$ are formed as P-type pocket regions adjacent to only the sources of the drive transistors $Q_d1$ and $Q_d2$ beneath the gate electrodes 3a and 3b thereof.

Figure 6A:
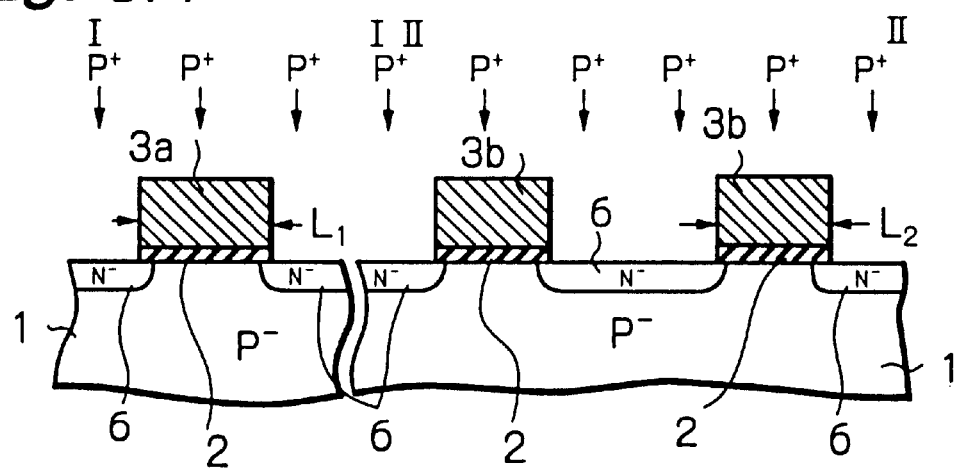
FIGS. 6A, 6B and 6C are cross-sectional views for explaining a second embodiment of the method for manufacturing the SRAM cell according to the present invention.
Figure 6B:
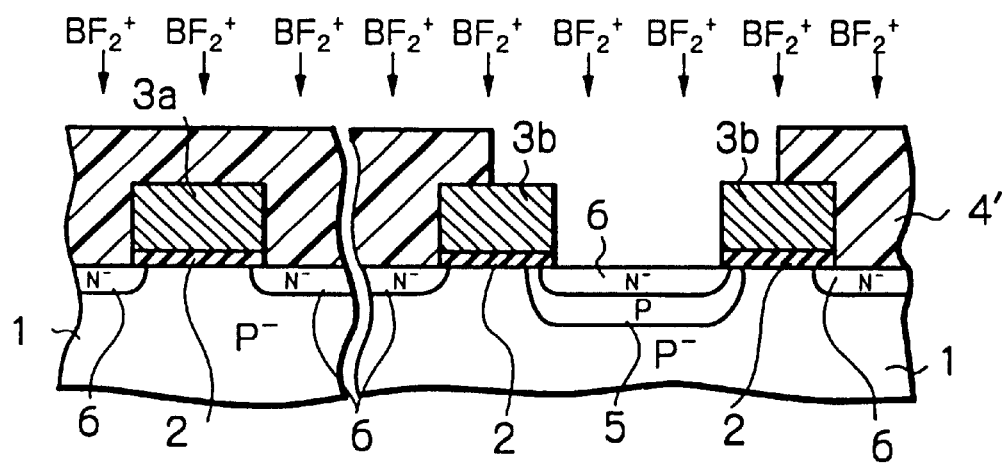
Figure 6C:
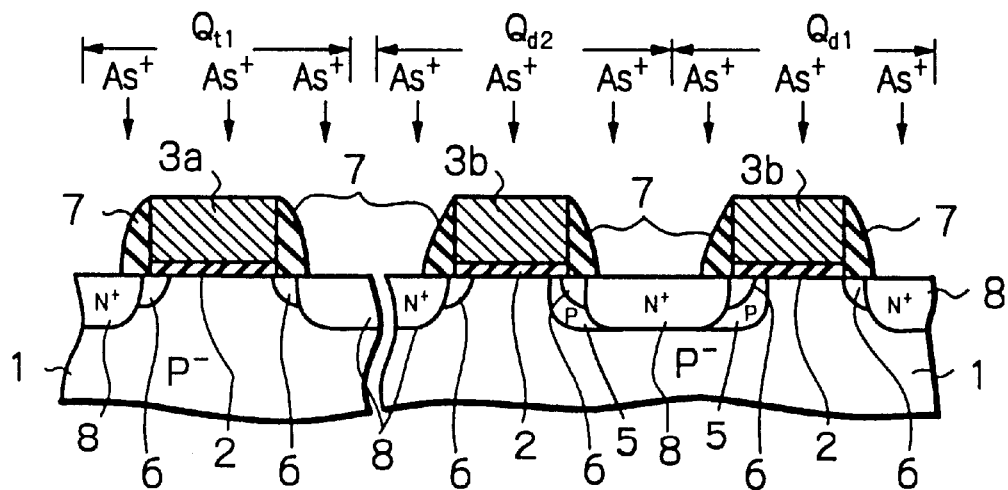

FIGS. 6A, 6B and 6C are cross-sectional views for explaining a second embodiment of the method for manufacturing an SRAM cell according to the present invention. Note that an equivalent circuit and a plan view of this SRAM cell are also illustrated in FIGS. 1 and 2.

First, referring to FIG. 6A, a P-type monocrystalline silicon substrate 1 having an impurity concentration of about $1\times10^{16}$ to $1\times10^{18}$ cm$^3$ is thermally oxidized to form a gate silicon oxide layer 2 on the substrate 1. Then, gate electrodes 3a and 3b are formed on the gate silicon oxide layer 3. Then, the gate silicon oxide layer 2 is etched out in self-alignment with the gate electrodes 3a and 3b. Note that the length $L_1$ of the gate electrodes 3a of the transfer transistors $Q_t1$ and $Q_t2$ is larger than the length $L_2$ of the gate electrodes 3b of the drive transistors $Q_d1$ and $Q_d2$. Then, about $1\times10^{13}$ to $1\times10^{14}$ phosphorous or arsenic ions per cm$^2$ are implanted at an energy of about 5 to 30 keV into the substrate 1 by using the gate electrodes 3a and 3b as a mask to form N-type impurity diffusion regions 6 of an LDD configuration.

Next, referring to FIG. 6B, a photoresist pattern 4' having an opening corresponding to the sources of the drive transistors $Q_d1$ and $Q_d2$ is formed by a photolithography process. Then, about $1\times10^{13}$ to $1\times10^{14}$ boron fluoride ions per cm$^2$ are implanted at an energy of about 20 to 120 keV and at an incident angle of 0° to about 60° into the substrate 1 by using the photoresist pattern 4' as a mask. As a result, P-type impurity diffusion regions 5 are formed within the substrate 1.

Then, the photoresist pattern 4' is removed.

Finally, referring to FIG. 6C, in the same way as in FIG. 5C, a silicon nitride layer is formed on the entire surface, and an anisotropic etching operation is performed upon the silicon nitride layer to form a sidewall silicon nitride layer 7 on the sidewalls of the gate electrodes 3a and 3b. Then, about $1\times10^{15}$ to $1\times10^{16}$ arsenic ions per cm$^2$ are implanted at an energy of about 10 keV to 100 keV into the substrate 1 by using the sidewall silicon nitride layer 7 as a mask to form N+-type impurity diffusion regions 8 of the LDD configuration.

Thus, even in the second embodiment, the N--type impurity diffusion regions 6 having an impurity concentration of about $1\times10^{19}$ cm$^{-3}$ and the N+-type impurity diffusion regions 8 having an impurity concentration of about $2\times10^{20}$cm$^{-3}$ form the sources/drains of the transistors, and the P-type impurity diffusion regions 5 having an impurity concentration of about $1\times10^{18}$ cm$^{-3}$ are formed as P-type pocket regions adjacent to only the sources of the drive transistors $Q_d1$ and $Q_d2$ beneath the gate electrodes 3a and 3b thereof.

Figure 7A:
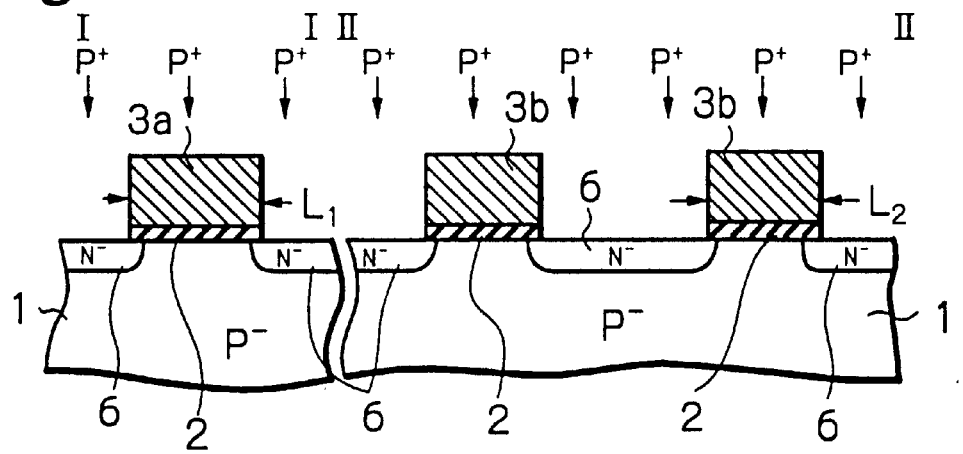
FIGS. 7A, 7B and 7C are cross-sectional views for explaining a third embodiment of the method for manufacturing the SRAM cell according to the present invention.
Figure 7B:
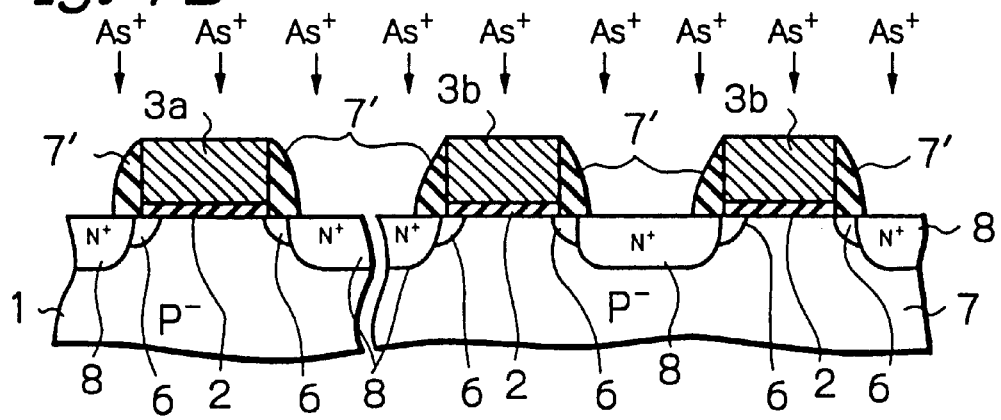
Figure 7C:
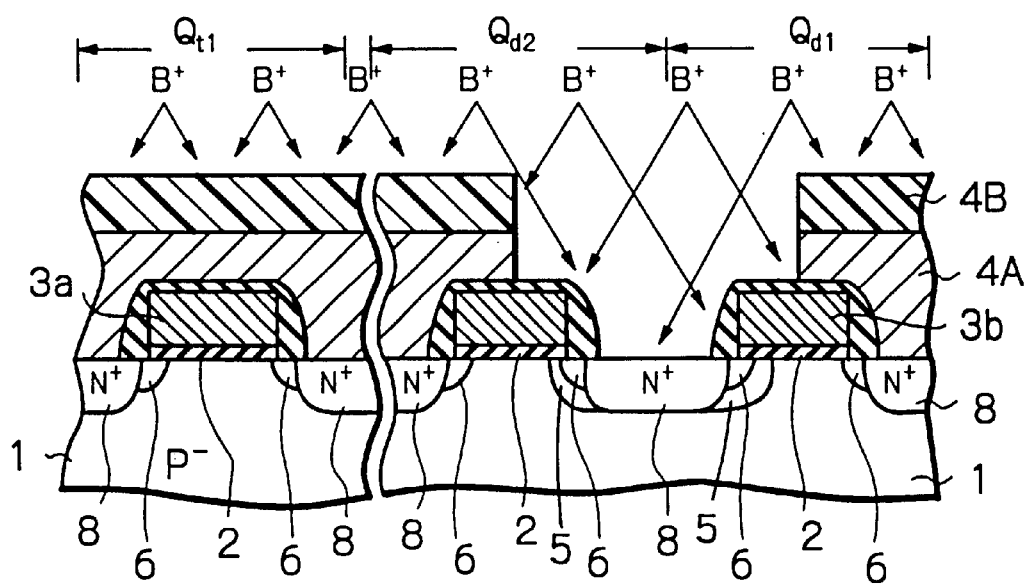

FIGS. 7A, 7B and 7C are cross-sectional views for explaining a third embodiment of the method for manufacturing an SRAM cell according to the present invention. Note that an equivalent circuit and a plan view of this SRAM cell are also illustrated in FIGS. 1 and 2.

First, referring to FIG. 7A in the same way as in FIG. 5A, a P-type monocrystalline silicon substrate 1 having an impurity concentration of about $1\times10^{16}$ to $1\times10^{18}$ cm$^3$ is thermally oxidized to form a gate silicon oxide layer 2 on the substrate 1. Then, gate electrodes 3a and 3b are formed on the gate silicon oxide layer 3. Then, the gate silicon oxide layer 2 is etched out in self-alignment with the gate electrodes 3a and 3b. Note that the length $L_1$ of the gate electrodes 3a of the transfer transistors $Q_t1$ and $Q_t2$ is larger than the length $L_2$ of the gate electrodes 3b of the drive transistors $Q_d1$ and $Q_d2$. Then, about $1\times10^{13}$ to $1\times10^{14}$ phosphorous or arsenic ions are implanted at an energy of about 5 to 30 kev into the substrate 1 by using the gate electrodes 3a and 3b as a mask to form N-type impurity diffusion regions 6 of an LDD configuration.

Next, referring to FIG. 7B, a silicon nitride layer is formed on the entire surface, and an anisotropic etching operation is performed upon the silion nitride layer to form a protection layer 7' on the sidewalls of the gate electrodes 3a and 3b. Then, about $1\times10^{15}$ to $1\times10^{16}$ arsenic ions per cm$^2$ are implanted at an energy of about 10 kev to 100 keV into the substrate 1 by using the protection layer 7' as a mask to form N+-type impurity diffusion regions 8 of the LDD configuration.

Finally, referring to FIG. 7C, a silicon oxide layer 4A is deposited on the entire surface. Then, a photoresist pattern 4B having an opening corresponding to the sources of the drive transistors $Q_d1$ and $Q_d2$ is formed by a photolithography process. Then, the silicon oxide layer 4A is etched out by using the photoresist pattern 4B as a mask. Then, about $1\times10^{13}$ to $1\times10^{14}$ boron ions per cm$^2$ are implanted at an energy of about 20 to 150 keV and at an incident angle of about 15° to 60° by using the photoresist pattern 4B and the silicon oxide layer 4A. As a result, P-type impurity diffusion regions 5 are formed within the substrate 1. Then, the photoresist pattern 4B is removed.

In FIG. 7C, boron fluoride ions instead of boron ions can be implanted into the substrate 1. In this case, the implanting conditions are a doze amount of about $1\times10^{13}$ to $1\times10^{14}$ ions per cm$^2$ at an energy of about 80 to 400 kev and at an incident angle of about 15° to 60°. Thus, even in the third embodiment, the N-type impurity diffusion regions 6 having an impurity concentration of about $1\times10^{19}$ cm$^{-3}$ and the N-type impurity diffusion regions 8 having an impurity concentration of about $2\times10^{20}$ cm$^{-3}$ form the sources/drains of the transistors, and the P-type impurity diffusion regions 5 having an impurity concentration of about $1\times10^{18}$ cm$^{-3}$ are formed as P-type pocket regions adjacent to only the sources of the drive transistors $Q_d1$ and $Q_d2$ beneath the gate electrodes 3a and 3b thereof.

Figure 8:
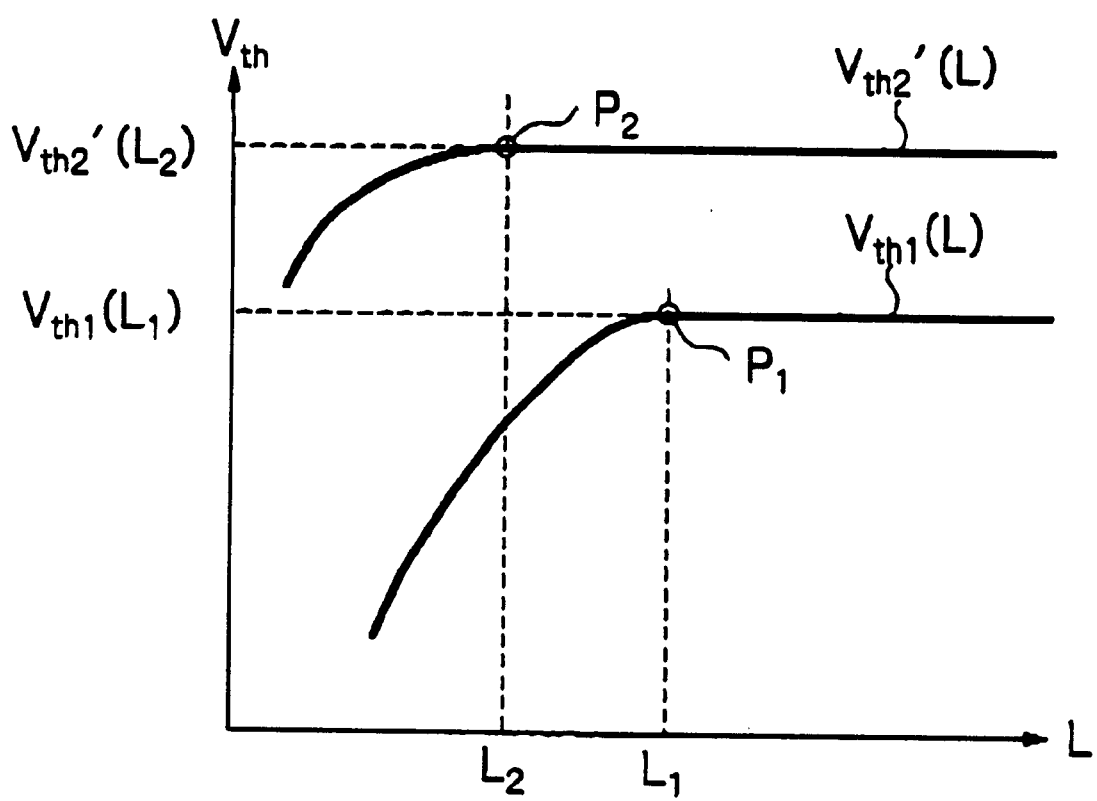
FIG. 8 is a graph showing the threshold voltage characteristics of the transistors according to the present invention.

In the above-described embodiments, since the P-type pocket regions (P-type impurity diffusion regions) 5 are provided on only the sides of the sources of the drive transistors $Q_d1$ and $Q_d2$, the short channel effect of the drive transistors $Q_d1$ and $Q_d2$ is suppressed. As a result, as shown in FIG. 8, which shows the threshold voltage characteristics of the transfer transistors $Q_t1$ and $Q_t2$ and the drive transistors $Q_d1$ and $Q_d2$, the threshold voltage,$V_{th}2'$ (L) of the drive transistors $Q_d1$ and $Q_d2$ is higher than the threshold voltage $V_{th}2$ (L) of the transfer transistors $Q_d1$ and $Q_d2$. In this case, the flat range of the threshold voltage $V_{th}2'$ (L) of the drive transistors $Q_d1$ and $Q_d2$ is larger than that of the threshold voltage $V_{th}1$ (L) of the transfer transistors $Q_t1$ and $Q_t2$.

Additionally, in order to increase the gate width W of the drive transistors $Q_d1$ and $Q_d2$ and decrease the gate length L of the drive transistors $Q_d1$ and $Q_d2$, the threshold voltage $V_{th}1$ (L) of the transfer transistors $Q_t1$ and $Q_t2$ is set to be a value $V_{th}1$ (L$_1$) as indicated by P$_1$ in FIG. 8, and the threshold voltage $V_{th}2'$ (L) of the drive transistors $Q_d1$ and $Q_d2$ is set to be a value $V_{th}2'$ (L$_2$) as indicated by P$_2$ in FIG. 8. That is, in FIG. 8, since the threshold voltage $V_{th}2'$ (L) of the drive transistors $Q_d1$ and $Q_d2$ is set in a range where the threshold voltage $V_{th}2'$ (L) hardly depends upon the gate length L thereof, the set threshold voltage $V_{th}2'$ (L$_2$) of the drive transistors $Q_d1$ and $Q_d2$ hardly fluctuates.

Figure 9A:
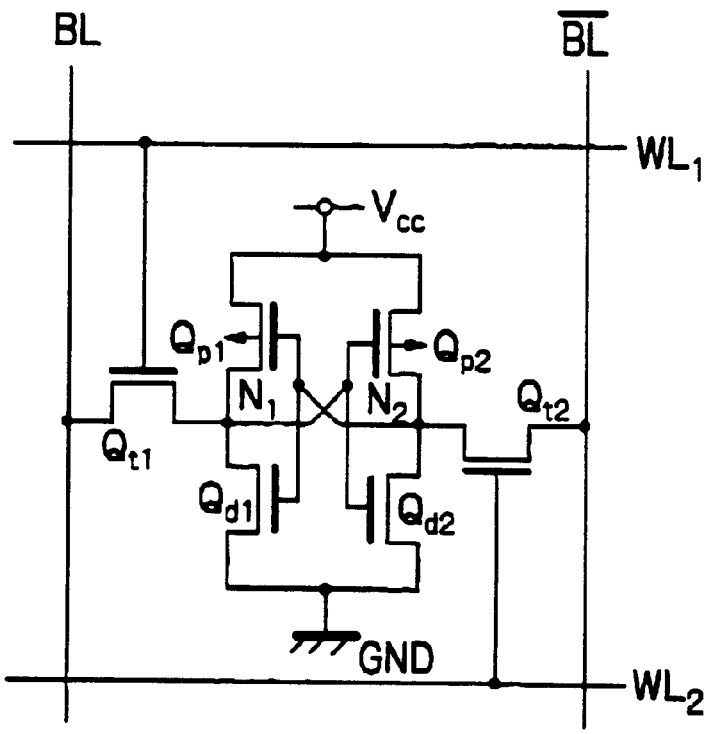
FIGS. 9A and 9B are equivalent circuit diagrams of SRAM cells to which the present invention is applied.
Figure 9B:
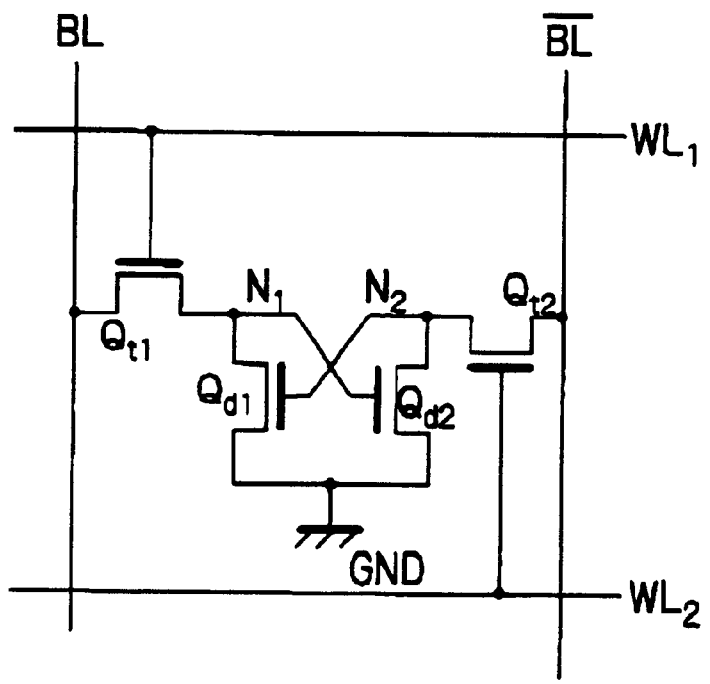

The present invention can be applied to other SRAM cells such as a thin film transistor (TFT) load type SRAM as illustrated in FIG. 9A where P-channel TFTs $Q_p1$ and $Q_p2$ are provided as loads, and a non-load type SRAM cell as illustrated in FIG. 9B.

As explained hereinabove, according to the present invention, the fluctuation of the threshold voltage of drive transistors in an SRAM can be suppressed without degrading the integration.

What is claimed is:

1. A static random access memory cell including two cross-coupled drive MOS transistors and two transfer MOS transistors connected to said drive MOS transistors, comprising:

a semiconductor substrate of a first conductivity type;

a plurality of gate electrodes of said drive MOS transistors and said transfer MOS transistors, formed over said semiconductor substrate;

a plurality of first impurity diffusion regions of a second conductivity type opposite to said first conductivity type, formed within said semiconductor substrate, each of said first impurity regions forming one of drains and sources of said drive MOS transistors and said transfer MOS transistors;

a plurality of pocket regions of said first conductivity type formed within said semiconductor substrate, each of said pocket regions being adjacent to substantially only the sides of the sources of said drive MOS transistors and immediately beneath the gate electrodes of said drive MOS transistors, and an impurity concentration of said pocket regions being larger than an impurity concentration of said semiconductor substrate.

2. The static random access memory cell as set forth in claim 1, wherein a length of said gate electrodes of said drive MOS transistors is smaller than a length of said gate electrodes of said transfer MOS transistors.

3. The static random access memory cell as set forth in claim 1, further comprising a plurality of second impurity diffusion regions of said second conductivity type, formed with said semiconductor substrate and adjacent to the sources and drains of said drive MOS transistors and said transfer MOS transistors, an impurity concentration of said second impurity diffusion regions being smaller than an impurity concentration of said first impurity diffusion regions.

4. The static random access memory cell as set forth in claim 1, further comprising two resistors connected as loads to said drive MOS transistors.

5. The static random access memory cell as set forth in claim 1, further comprising two thin film transistors connected as loads to said drive MOS transistors.

6. The static random access memory cell as set forth in claim 1, being of a non-load type.

* * * * *